United States Patent
Yamada et al.

(10) Patent No.: US 7,436,691 B2
(45) Date of Patent: Oct. 14, 2008

(54) SEMICONDUCTOR STORAGE DEVICE, OPERATION METHOD OF THE SAME AND TEST METHOD OF THE SAME

(75) Inventors: Yuki Yamada, Yokohama (JP); Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 11/236,560

(22) Filed: Sep. 28, 2005

(65) Prior Publication Data

US 2006/0114709 A1 Jun. 1, 2006

(30) Foreign Application Priority Data

Dec. 1, 2004 (JP) ............................. 2004-348567

(51) Int. Cl.
*G11C 11/22* (2006.01)
(52) U.S. Cl. .................. 365/145; 365/149; 365/185.23; 365/185.25
(58) Field of Classification Search ................. 365/145, 365/149, 185.23, 185.25
See application file for complete search history.

(56) References Cited

U.S. PATENT DOCUMENTS

| | | | | |
|---|---|---|---|---|
| 5,524,093 | A | * | 6/1996 | Kuroda |
| 6,101,119 | A | * | 8/2000 | Yi et al. ....................... 365/149 |
| 6,335,876 | B1 | * | 1/2002 | Shuto ........................... 365/145 |
| 6,853,576 | B2 | * | 2/2005 | Kato et al. .................... 365/145 |
| 7,031,180 | B2 | * | 4/2006 | Karasawa et al. ............. 365/145 |
| 7,054,182 | B2 | * | 5/2006 | Kang ........................... 365/145 |

FOREIGN PATENT DOCUMENTS

| | | |
|---|---|---|
| JP | 9-7378 | 1/1997 |
| JP | 09-282893 | 10/1997 |
| JP | 11-45584 | 2/1999 |
| JP | 2003-188350 | 7/2003 |

* cited by examiner

*Primary Examiner*—Connie C. Yoha
(74) *Attorney, Agent, or Firm*—Oblon, Spivak, McClelland, Maier & Neustadt, P.C.

(57) ABSTRACT

A semiconductor storage device includes a bit line; a word line; a plate line; a ferroelectric capacitor having a ferroelectric substance between electrodes, one of the electrodes being connected to the plate line, the ferroelectric capacitor being capable of storing data; a selection transistor connected between the other of the electrodes of the ferroelectric capacitor and the bit line, the selection transistor being capable of selectively connecting the ferroelectric capacitor to the bit line on the basis of a potential on the word line; a bit line driver corresponding to the bit line to drive the bit line; a word line driver corresponding to the word line to drive the word line; and a plate line driver corresponding to the plate line, the plate line driver including a plurality of plate voltage lines so as to be able to apply a plurality of different voltage values to the plate line, the plate line driver connecting a common single plate voltage line included in the plate voltage lines to the plate line when data is written or rewritten into the ferroelectric capacitor.

17 Claims, 10 Drawing Sheets

| S11 | S21 | S31 | SIGNAL LEVEL |
|---|---|---|---|
| H | H | H | Vsig3 |
| H | L | H | Vsig1 |
| L | L | H | Vsig2 |
| L | L | L | Vsig4 |

SEMICONDUCTOR STORAGE DEVICE, OPERATION METHOD OF THE SAME AND TEST METHOD OF THE SAME

CROSS-REFERENCE TO RELATED APPLICATIONS

This application is based upon and claims the benefit of priority from the prior Japanese Patent Applications No. 2004-348567, filed on Dec. 1, 2004, the entire contents of which are incorporated herein by reference.

BACKGROUND OF THE INVENTION

1. Field of the Invention

The present invention relates to a semiconductor storage device, an operation method of the semiconductor storage device and a test method of the semiconductor storage device.

2. Background Art

A ferroelectric memory is described in Japanese Patent Application Laid-Open No. 9-7378. The ferroelectric memory is a memory which stores a value of binary values associated with the directions of residual dielectric polarization of a ferroelectric substance. Data which can be stored in a single memory cell is only one bit.

A multi-value ferroelectric memory capable of storing a plurality of bits in a single memory cell is described in Japanese Patent Application Laid-Open No. 2003-188350. This ferroelectric memory has a memory cell structure of the so-called 1T (Transistor) type. In the ferroelectric memory, a plurality of bits are stored in a memory cell by changing the residual dielectric polarization quantity of a ferroelectric capacitor by changing a voltage applied to a memory cell at the time of writing and thereby changing the residual dielectric polarization quantity of a ferroelectric capacitor.

In the ferroelectric memory of 1T (one transistor)-type, data remain in the memory cells at the time of readout. In other words, non-destructive readout is possible. In general, however, it is difficult to manufacture such a ferroelectric memory of 1T-type as compared with the 1T-1C (1 Transistor-1 Capacitor) type memory cell structure which is widely advanced in development at the present time.

In the 1T-1C type ferroelectric memory, it is also possible to store a plurality of bits in a single memory cell. For storing a plurality of bits in a single memory cell, however, a plurality of write voltages are needed at the time of data writing. In addition, in the 1T-1C type ferroelectric memory, data does not remain in the memory cells. In other words, the data may be destroyed at the time of readout. At the time of readout, therefore, it is necessary to rewrite the same data in the memory cells. At the time of the data rewriting as well, a plurality of write voltages are needed.

Thus, unlike the flash memory, it is difficult in the ferroelectric memory to increase the degree of integration by using the technique of storing a plurality of bits in a single memory cell and provide an inexpensive, large-capacity memory.

A semiconductor storage device is desired, which has a ferroelectric memory that is highly integrated, inexpensive, a large capacity ferroelectric memory by storing a plurality of bits in a single memory cell.

SUMMARY OF THE INVENTION

A semiconductor storage device according to an embodiment of the present invention includes a bit line; a word line; a plate line; a ferroelectric capacitor having a ferroelectric substance between electrodes, one of the electrodes being connected to the plate line, the ferroelectric capacitor being capable of storing data; a selection transistor connected between the other of the electrodes of the ferroelectric capacitor and the bit line, the selection transistor being capable of selectively connecting the ferroelectric capacitor to the bit line on the basis of a potential on the word line; a bit line driver corresponding to the bit line to drive the bit line; a word line driver corresponding to the word line to drive the word line; and a plate line driver corresponding to the plate line, the plate line driver including a plurality of plate voltage lines so as to be able to apply a plurality of different voltage values to the plate line, the plate line driver connecting a common single plate voltage line included in the plate voltage lines to the plate line when data is written or rewritten into the ferroelectric capacitor.

An operation method of a semiconductor storage device according to an embodiment of the present invention includes, the semiconductor storage device, which includes a bit line; a word line; a plate line; a ferroelectric capacitor having a ferroelectric substance between electrodes, one of the electrodes being connected to the plate line, the ferroelectric capacitor being capable of storing data; a selection transistor connected between the other of the electrodes of the ferroelectric capacitor and the bit line, the selection transistor being capable of selectively connecting the ferroelectric capacitor to the bit line on the basis of a potential on the word line; a bit line driver corresponding to the bit line to drive the bit line; a word line driver corresponding to the word line to drive the word line; and a plate line driver corresponding to the plate line and the plate line driver driving the plate line, the method includes: selecting one of a plurality of plate voltages for the ferroelectric capacitor, when the ferroelectric capacitor is initialized, so as to apply the selected plate voltage to the plate line corresponding to the ferroelectric capacitor; applying a common single plate voltage included in the plate voltages to the plate line when data is written into the ferroelectric capacitor; reading out the data from the ferroelectric capacitor; and applying a common single plate voltage included in the plate voltages to the plate line in the plate line driver when the data is rewritten into the ferroelectric capacitor.

A test method of a semiconductor storage device according to an embodiment of the present invention includes, the semiconductor storage device including a bit line; a word line; a plate line; a ferroelectric capacitor having a ferroelectric substance between electrodes, one of the electrodes being connected to the plate line, the ferroelectric capacitor being capable of storing data; a selection transistor connected between the other of the electrodes of the ferroelectric capacitor and the bit line, the selection transistor being capable of selectively connecting the ferroelectric capacitor to the bit line on the basis of a potential on the word line; a bit line driver corresponding to the bit line to drive the bit line; a word line driver corresponding to the word line to drive the word line; and a plate line driver corresponding to the plate line and the plate line driver driving the plate line, the method includes: writing data into the ferroelectric capacitor by using a common single plate voltage of a plurality of plate voltages when the semiconductor storage device is tested, the common single plate being used for a read/writing operation; and selecting one of the plate voltages for the ferroelectric capacitor, when the ferroelectric capacitor is initialized, so as to apply the selected plate voltage to the plate line corresponding to the ferroelectric capacitor.

DETAILED DESCRIPTION OF THE INVENTION

Hereafter, embodiments according to the present invention will be described with reference to the drawings. The embodiments do not restrict the present invention. In the ensuing embodiments, dielectric polarization characteristics can be altered for each ferroelectric capacitor by applying a plurality of initialization voltages. As a result, it is possible to provide a semiconductor storage device having ferroelectric capacitors capable of storing data including a plurality of bits. The initialization is processing of altering the residual dielectric polarization characteristics by applying a voltage equal to or more than read/write voltage to a ferroelectric capacitor.

FIRST EMBODIMENT

Figure 1:
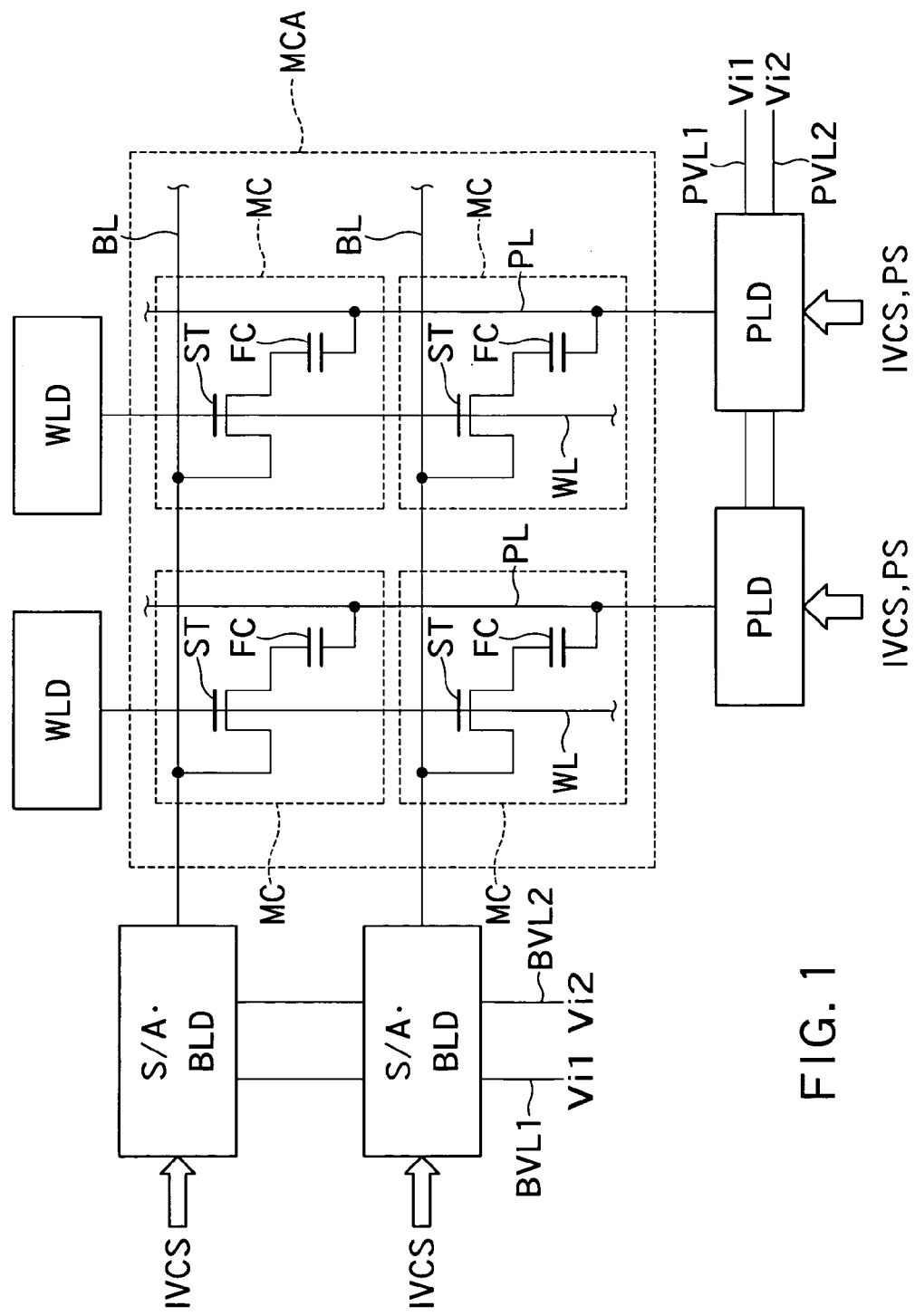
FIG. 1 is a block diagram of a semiconductor storage device 100 according to a first embodiment of the present invention.

FIG. 1 is a block diagram of a semiconductor storage device 100 according to a first embodiment of the present invention. The semiconductor storage device 100 includes a memory cell array MCA in which a plurality of memory cells MC are arranged in a matrix form. Each memory cell MC is a memory cell of 1T-1C type, and it includes a ferroelectric capacitor FC and a selection transistor ST. For the sake of convenience, only four memory cells are illustrated.

The ferroelectric capacitor FC has a ferroelectric substance between electrodes. One of the electrodes is connected to a plate line PL, and the other is connected to the selection transistor ST at its source or drain. The selection transistor ST may be a conventional MOSFET. The selection transistor ST is connected between a bit line BL and a ferroelectric capacitor FC. The selection transistor ST is connected at its gate to a word line WL. The gate of the selection transistor ST is used to selectively connect the ferroelectric capacitor FC to a bit line BL on the basis of a potential at the word line WL.

The word lines WL are connected to corresponding word line drivers WLD, respectively. The bit lines BL are connected to corresponding sense amplifiers S/A and bit line drivers BLD, respectively. The plate lines PL are connected to corresponding plate line drivers PLD, respectively.

Each bit line driver BLD can connect some of a plurality of (two, in the present embodiment) bit voltage lines BVL1 and BVL2 to a bit line BL. The bit voltage lines BVL1 and BVL2 transmit initializing voltages Vi2 and Vi2 to the bit line BL, respectively. Each plate line driver PLD can connect some of a plurality of (two, in the present embodiment) plate voltage lines PVL1 and PVL2 to a plate line PL. The plate voltage lines PVL1 and PVL2 transmit initializing voltages Vi1 and Vi2 to the plate line PL, respectively.

Figure 2:
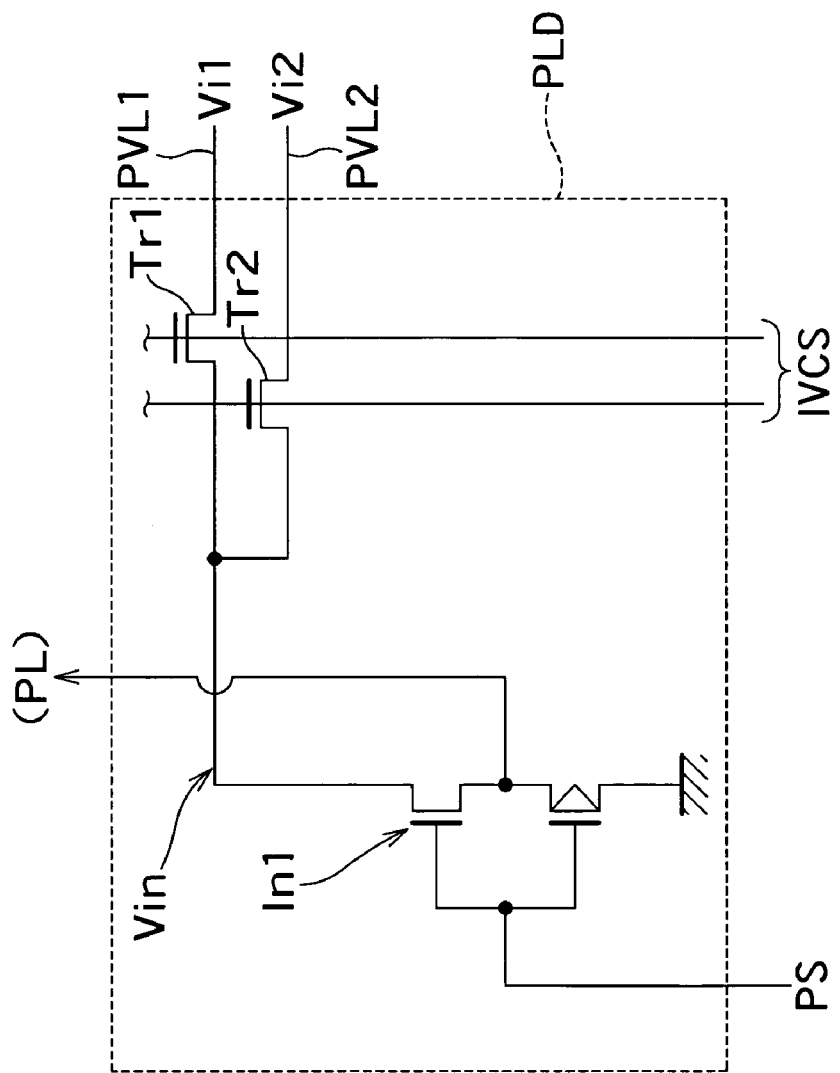
FIG. 2 is a circuit diagram showing a configuration of a plate line driver PLD.

FIG. 2 is a circuit diagram showing a configuration of each plate line driver PLD. The plate line driver PLD includes transistors Tr1 and Tr2 controlled by an initial voltage control signal IVCS supplied from the outside. The initial voltage control signal IVCS can connect the plate voltage line PVL1 or PVL2 to inverters In1 by turning on either of the transistors Tr1 and Tr2. The voltage applied to the inverters In1 is denoted by Vin. The inverters In1 can connect either the voltage Vin or ground to the plate line PL on the basis of a plate signal PS supplied from the outside. Since the bit line driver BLD is combined with the sense amplifier S/A, it has not the same configuration as the plate line driver PLD. However, the bit line driver BLD can be implemented by using a configuration similar to that of the plate line driver PLD. Therefore, illustration of a detailed configuration of the bit line driver BLD is omitted.

Figure 3:
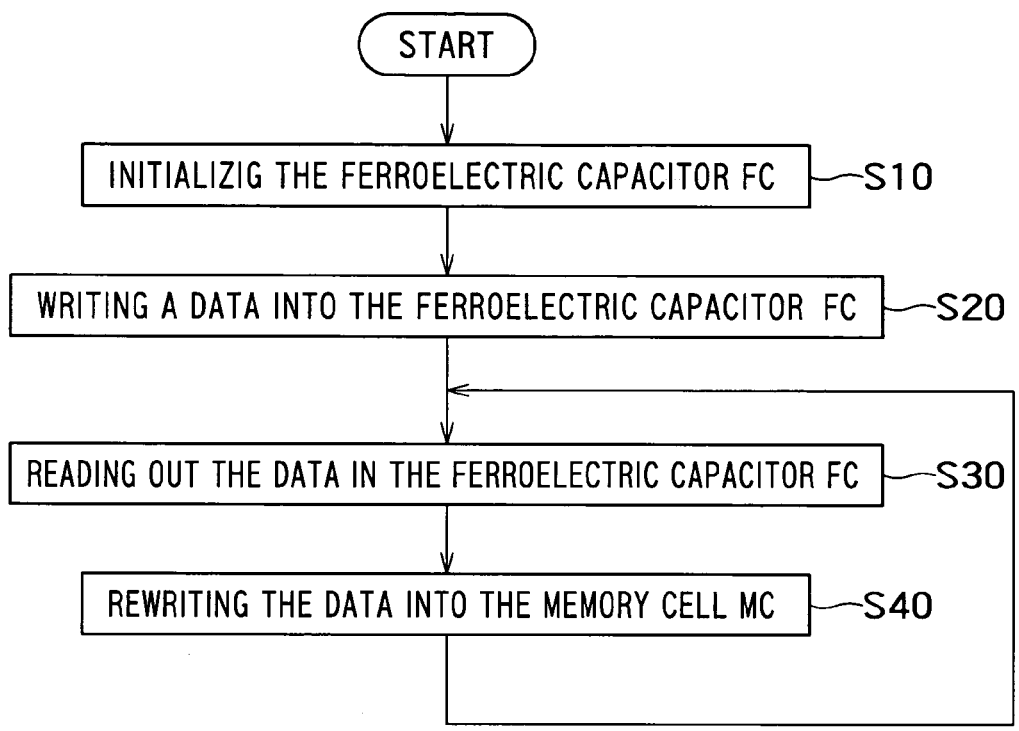
FIG. 3 is a flow diagram showing an operation flow of the semiconductor storage device 100.

FIG. 3 is a flow diagram showing an operation flow of the semiconductor storage device 100. First, initialization of the ferroelectric capacitor FC is executed (S10). The initialization is processing of determining the dielectric polarization characteristics of the ferroelectric capacitor FC by applying a voltage to the ferroelectric capacitor FC. This initialization is executed every memory cell MC. In other words, a plurality of memory cells in the same memory cell array MCA are initialized with different initializing voltages in some cases.

Subsequently, data is written into the ferroelectric capacitor FC (S20). At this time, the plate line drivers PLD connect a common single plate voltage line included in the plate voltage lines PVL1 and PVL2 to the plate line PL. For example, if the plate voltage line PVL2 is set as a plate voltage line at the time of writing, the plate voltage line PVL1 is used only as the initializing voltage. At the time of writing, the plate voltage line PVL1 is not used, but only the plate voltage line PVL2 is used in every memory cell.

Similarly, the bit line drivers BLD connect a common single bit voltage line included in the bit voltage lines BVL1 and BVL2 to the bit line BL. For example, if the bit voltage line BVL2 is set as a bit voltage line at the time of writing, the bit voltage line BVL1 is used only as the initializing voltage. At the time of writing, the bit voltage line BVL1 is not used, but only the plate voltage line BVL2 is used in every memory cell.

After the data is written at the step S20, the same data might be written again. However, data different from the data is not written newly. In other words, the semiconductor storage device 100 is an OTP (one time program) memory.

After the data writing, the semiconductor storage device 100 can be packaged, and shipped as a product. Therefore, the ensuing steps S30 and S40 may be regarded as steps at the time of user's use.

Subsequently, the data in the ferroelectric capacitor FC is read out (S30). At this time, the sense amplifier S/A detects data stored in the ferroelectric capacitor FC, via the bit line BL.

After the data is read out, the data thus read out needs to be rewritten into the memory cell MC (S40). In the ferroelectric memory of 1T-1C type, data does not remain in the memory cell at the time of readout as described above. After data is read out, therefore, the data is written again into the memory cell connected to the word line WL that is the subject of readout. At this time, the plate line driver PLD and the bit line driver BLD operate in the same way as the step S20. Since the semiconductor storage device 100 is the OTP memory as described above, the rewritten data is the same as the data read out.

Thus, in the operation of the present embodiment, a plurality of plate voltages and a plurality of bit voltages are used in the initialization (S10). Once initialization is finished, however, only a common single plate voltage and a common single bit voltage are used in the subsequent write/rewrite operation (S20 and S40). The common single plate voltage and the common single bit voltage in the write/rewrite operation are referred to as operation voltage Vop. By the way, the initializing voltages Vi1 and Vi2 are voltages that are equal to or more than the operation voltage Vop.

Figure 4:
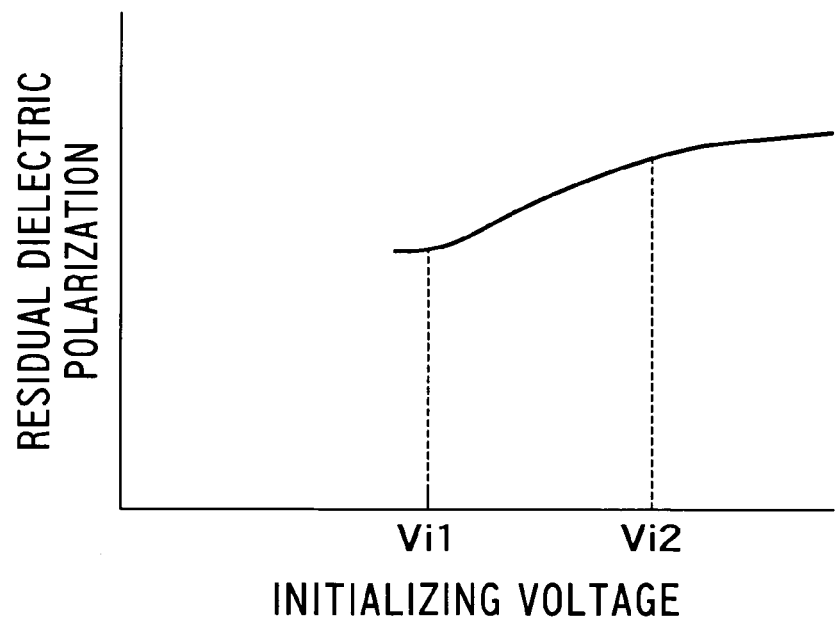
FIG. 4 is a graph showing dielectric polarization characteristics of the ferroelectric capacitor FC as a function of the initializing voltage applied to the ferroelectric capacitor FC.
Figure 5:
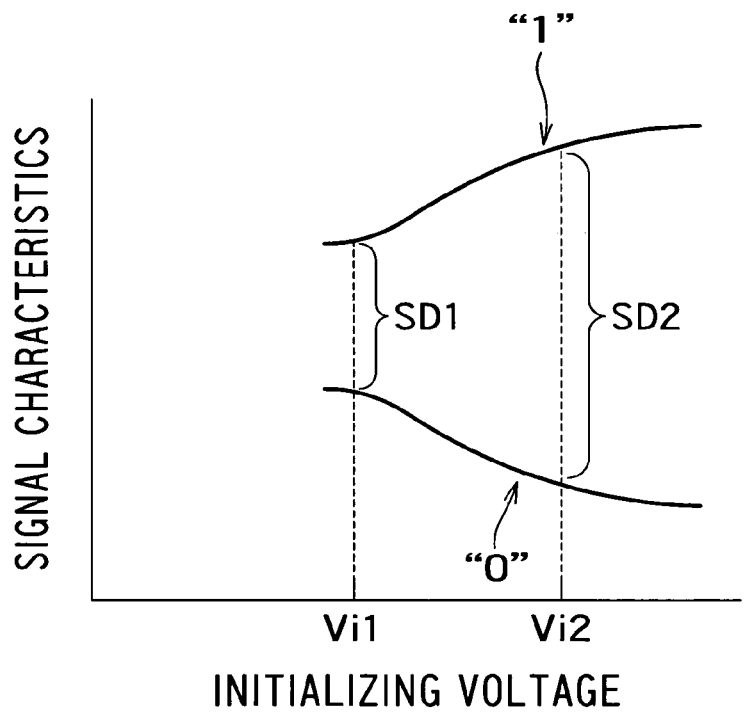
FIG. 5 is a graph showing signal characteristics of the ferroelectric capacitor FC as a function of the initializing voltage applied to the ferroelectric capacitor FC.

FIGS. 4 and 5 are graphs showing dielectric polarization characteristics of the ferroelectric capacitor FC as a function of the initializing voltage applied to the ferroelectric capacitor FC. If the initializing voltage exceeds the predetermined voltage value Vi1, the residual dielectric polarization quantity of the ferroelectric capacitor FC becomes large as the initializing voltage becomes high as shown in FIG. 4. If this change in residual dielectric polarization quantity is used, the signal difference of the ferroelectric capacitor FC can be altered as shown in FIG. 5.

For example, when the initial voltage is equal to Vi1, the difference between a residual dielectric polarization quantity of a ferroelectric capacitor FC storing data "0" and a residual dielectric polarization quantity of a ferroelectric capacitor FC storing data "1" becomes a signal difference SD1. On the other hand, when the initial voltage is equal to Vi2, the difference between a residual dielectric polarization quantity of a ferroelectric capacitor FC storing data "0" and a residual dielectric polarization quantity of a ferroelectric capacitor FC storing data "1" becomes a signal difference SD2. Even if the write/rewrite voltage is constantly Vop, therefore, a plurality of ferroelectric capacitors FC that differ from each other in signal difference can store data that differ in signal difference, respectively.

Figure 6:
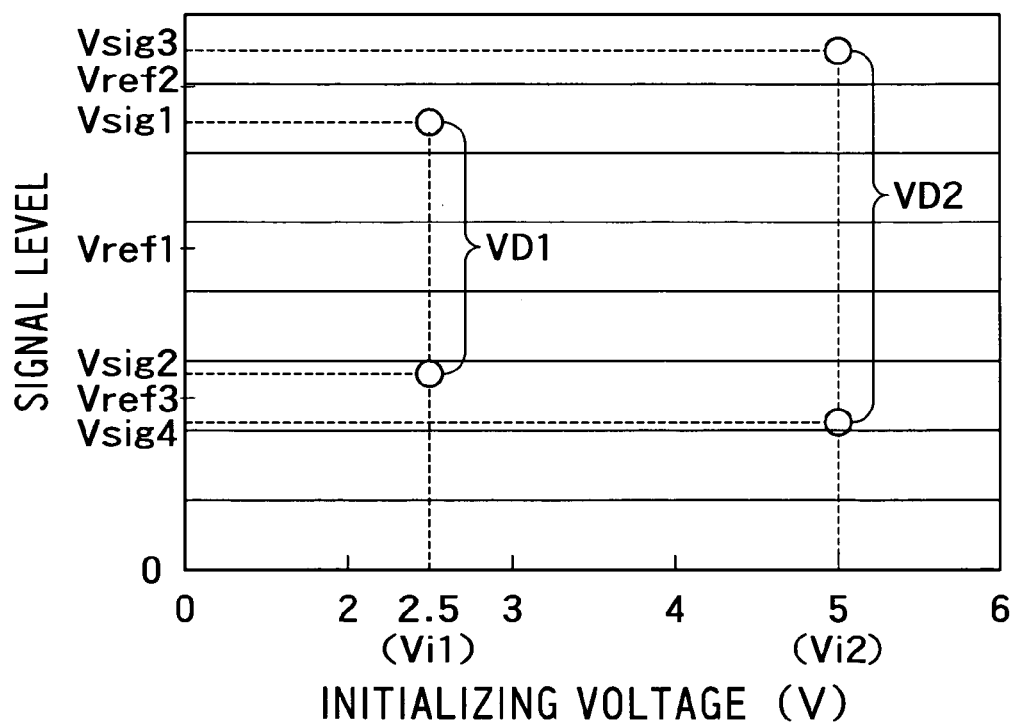
FIG. 6 is a graph showing a voltage of data read out as a function of the initializing voltage applied to the ferroelectric capacitor FC.

FIG. 6 is a graph showing a voltage of data read out as a function of the initializing voltage applied to the ferroelectric capacitor FC. As shown in FIG. 6, voltage differences of data read out differ on the basis of a difference between the signal differences SD1 and SD2 shown in FIG. 5. For example, if the ferroelectric capacitor FC is initialized with Vi1 (2.5 V) and data "1" is stored, the voltage read out becomes Vsig1. If the ferroelectric capacitor FC is initialized with Vi1 (2.5 V) and data "0" is stored, the voltage read out becomes Vsig2. If the ferroelectric capacitor FC is initialized with Vi2 (5 V) and data "1" is stored, the voltage read out becomes Vsig3. If the ferroelectric capacitor FC is initialized with Vi2 (5 V) and data "0" is stored, the voltage read out becomes Vsig4. If the ferroelectric capacitor FC is thus initialized with Vi1 (2.5 V), the signal voltage difference between data "1" and "0" becomes VD1. If the ferroelectric capacitor FC is thus initialized with Vi2 (5 V), the signal voltage difference between data "1" and "0" becomes VD2 which is greater than VD1.

The sense amplifier S/A has a middle value between the voltages read out Vsig1 and Vsig2, a middle value between the voltages read out Vsig1 and Vsig3, and a middle value between the voltages read out Vsig2 and Vsig4 respectively as reference voltages Vref1, Vref2 and Vref3. As a result, the sense amplifier S/A can detect the voltages read out Vsig1 to Vsig4.

For example, assuming that the voltages read out Vsig1 to Vsig4 correspond respectively to (0, 0), (0, 1), (1, 0) and (1, 1), it becomes possible for each ferroelectric capacitor FC to store 2-bit data.

Referring back to FIG. 2, operation of the plate line driver PLD conducted when the initializing voltage is applied and at the time of reading/rewriting will now be described in more detail. When applying the initializing voltage, the plate signal PS is high and the voltage Vin is applied to the plate line PL. The initial voltage control signal IVCS selectively turns on either the transistor Tr1 or Tr2. As a result, the voltage Vin becomes either the plate voltage Vi1 or Vi2, and either the plate voltage Vi1 or Vi2 is selectively applied to the plate line PL.

In the same way, the bit line driver BLD also connects either bit voltage line BVL1 or BVL2 to the bit line BL. As a result, either the bit voltage Vi1 or Vi2 is applied to the bit line BL.

For example, it is now supposed that Vi1<Vi2. If at this time the signal voltage difference of the ferroelectric capacitor FC in a certain memory cell MC is set equal to VD1, the initial voltage Vi1 is applied to each of the bit line BL and the plate line PL. If the signal voltage difference is set equal to VD2, the initial voltages Vi2 is applied to each of the bit line BL and the plate line PL.

In this way, the ferroelectric capacitor FC can be initialized with a plurality of initializing voltages. The plate line drivers PLD and the bit line drivers BLD are provided so as to correspond to the plate lines PL and bit lines BL. Therefore, an initializing voltage can be set every memory cell MC.

On the other hand, the initial voltage control signal IVCS is fixed when writing data. Therefore, a voltage Vpn is fixed to either the plate voltage Vp1 or Vp2. The plate signal PS can assume a high or low value. Therefore, the inverter In1 connects the plate line PL to the voltage Vpn or the ground. As a result, the memory cell MC can store data "1" or "0" corresponding to its dielectric polarization characteristics.

Figures 7A, 7B:
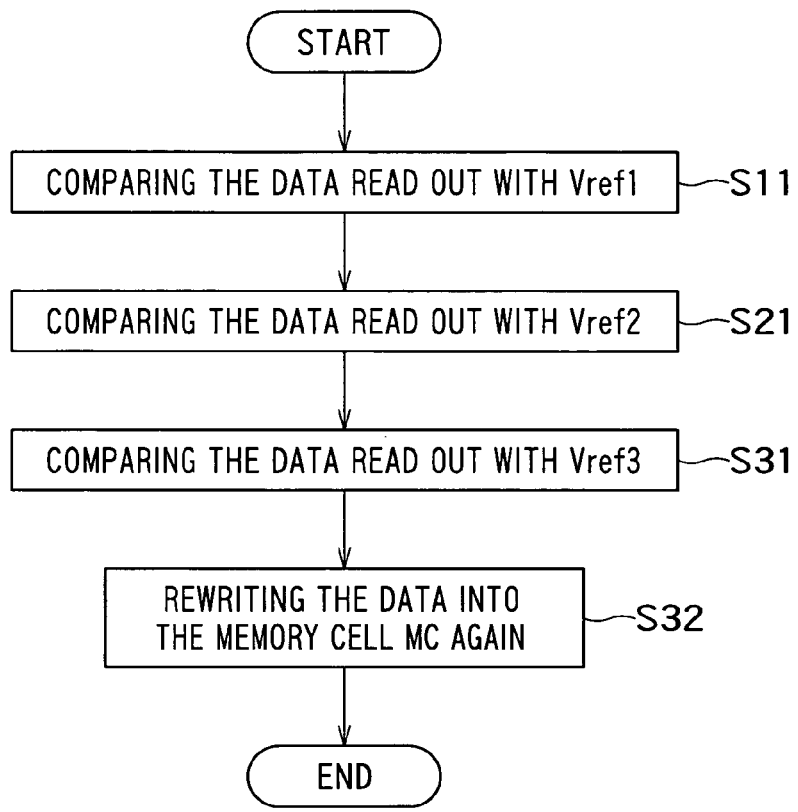
FIG. 7A is a flow diagram showing a flow of a method of reading out data from a memory cell MC.
FIG. 7B is a table showing an example of relations between the comparison results obtained at the steps S11, S21 and S31 and the data read out.
Figure 8:
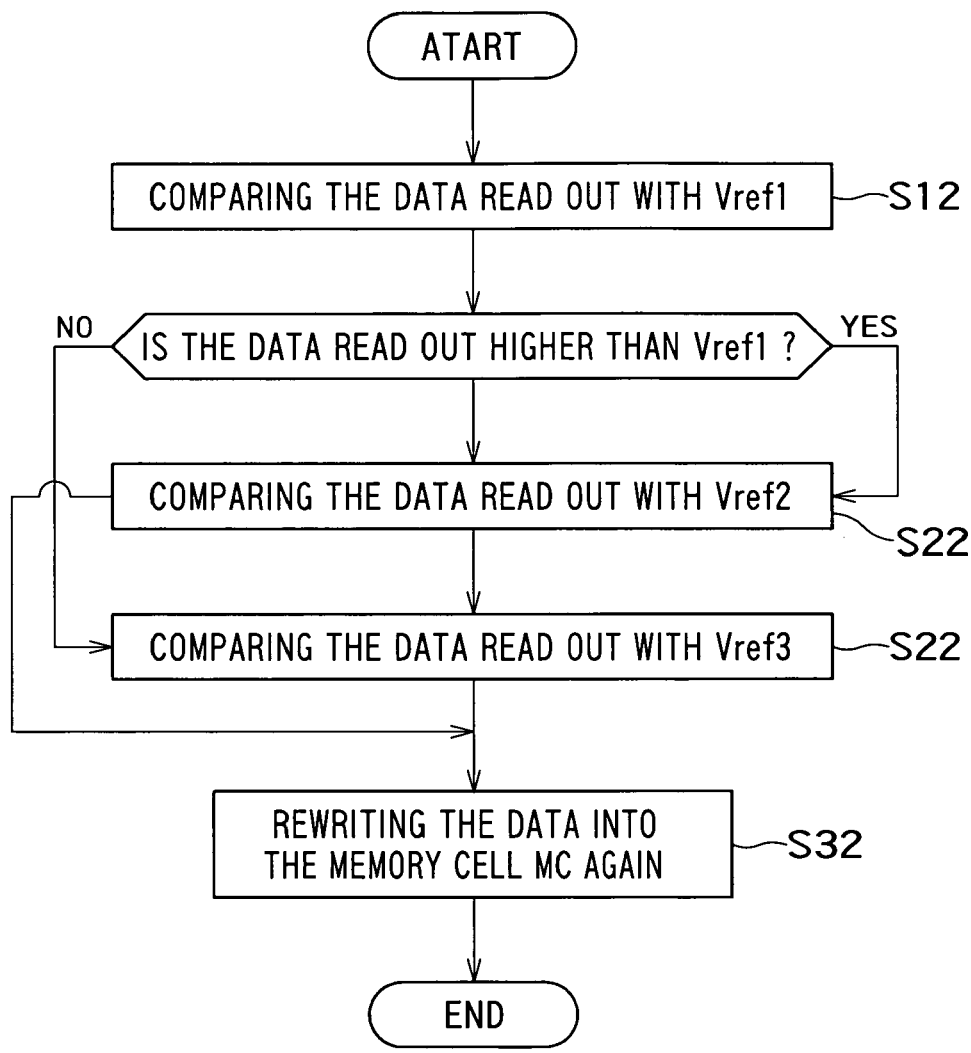
FIG. 8 is a flow diagram showing a flow of a method of reading out data from a memory cell MC.

FIG. 7A and FIG. 8 are flow diagrams showing a flow of a method of reading out data from a memory cell MC. As shown in FIG. 7A, the sense amplifier S/A uses the reference potentials in the order of Vref1, Vref2 and Vref3 in order to detect data read out. First, the sense amplifier S/A compares Vref1 with the data read out (S11). At this time, information as to whether the data read out is higher or lower than the reference potential Vref1 is obtained. This information is temporarily stored in order to judge final data later. Subsequently, the data read out is compared with Vref2 (S21). The result is temporarily stored in the same way as the comparison result of Vref1. In addition, the data read out is compared with Vref3 (S31). The result is temporarily stored in the same way as the comparison result of Vref1. Here, the signal level of data written into the memory cell MC is fixed on the basis of the comparison results obtained at the steps S11, S21 and S31.

FIG. 7B is a table showing an example of relations between the comparison results obtained at the steps S11, S21, S31 and the data read out. In the present embodiment, a circuit which decodes the comparison results obtained at the steps S11, S21 and S31, converts them to 2-bit data, and store the 2-bit data in the memory cell MC is needed. This circuit can be implemented by using a decoder circuit according to a known technique.

FIG. 7A is referred to again. Finally, data destroyed by the readout is written back into the memory cell MC again (S32). This can be implemented by writing back the result of the comparison with Vref1. In this way, readout of data and subsequent rewriting of the data can be conducted. In the above-described example, the reference potential is used in the order of Vref1, Vref2 and Vref3. Even if the reference potential is used in the order of Vref1, Vref3 and Vref2, however, the readout can be conducted in the same way.

As shown in FIG. 7, the sense amplifier S/A may use the reference voltages in the ascending order in order to detect data read out. In other words, the sense amplifier S/A first compares Vref3 with the data read out (S11). Subsequently, Vref1 is compared with the data read out (S21). Finally, Vref2 is compared with the data read out (S31). On the contrary, the sense amplifier S/A may use the reference voltages in the descending order in order to detect data read out. As a result, data stored in each memory cell can be detected in three steps.

In the readout method shown in FIG. 8, the sense amplifier S/A first compares Vref1 with the data read out (S12). If the data read out is higher than Vref1, the sense amplifier S/A compares vref2 with the data read out. If the data read out is lower than Vref1, the sense amplifier S/A compares vref3 with the data read out (S22). In this case, data stored in each memory can be detected in substantially two steps. As compared with the reference voltages are used in the ascending order or in the descending order, therefore, the readout time can be shortened.

The first embodiment is used as an OTP memory. By initializing the ferroelectric capacitor FC with a plurality of initializing voltages, multi-value data having a plurality of bits can be stored in a single memory cell MC. As a result, the semiconductor storage device 100 can store data of a larger capacity per unit area as compared with the conventional ferroelectric memory.

At the time of multi-data writing/rewriting, it suffices to use the common single plate voltage line and the common single bit voltage line. As a result, it suffices to use one voltage source for the multi-value data writing/rewriting, and a plurality of voltage sources are not needed. This results in cost reduction of the semiconductor storage device 100.

In the first embodiment, the initializing voltage control signal IVCS and the plate signal PS are input from the outside. In other words, it is not necessary to provide the initializing voltage control circuit within a chip. As a result, the chip size can be reduced.

In the present embodiment, the initializing voltages of two kinds (Vi1 and Vi2) are used. However, initializing voltages of at least three kinds may be used. As a result, it becomes possible to store data of at least 3 bits in a single memory cell MC.

In addition, the lowest voltage among the initializing voltages may not be applied. For example, if initializing voltages of two kinds (V i 1 and V i 2) are used, it is possible to initialize the ferroelectric capacitor FC with only the initializing voltage Vi2 and not to initialize the ferroelectric capacitor FC with the initializing voltage Vi1. Because the dielectric polarization characteristics can be altered every memory cell even in such a case.

SECOND EMBODIMENT

Figure 9:
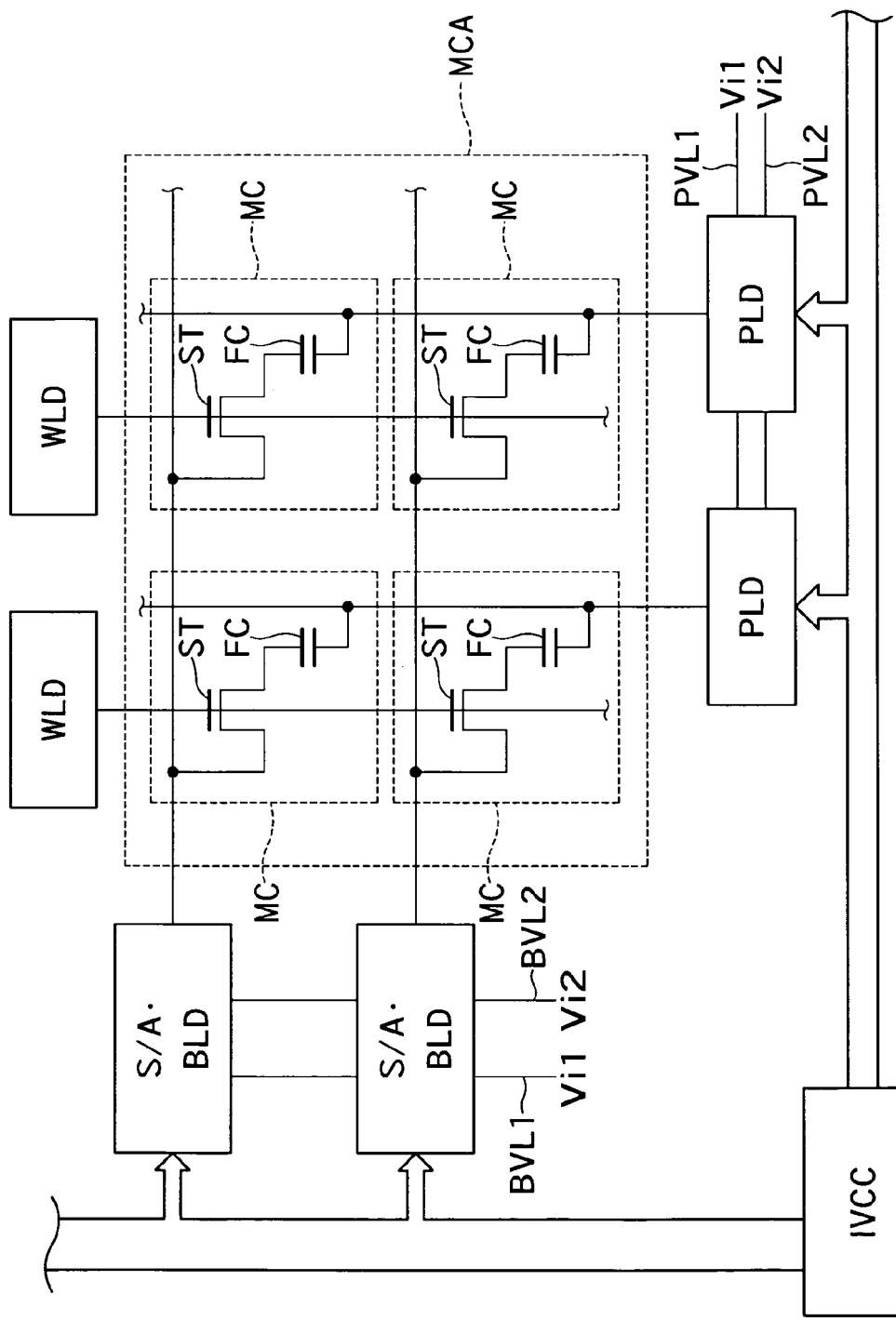
FIG. 9 is a block diagram of a semiconductor storage device 200 according to a second embodiment of the present invention.

FIG. 9 is a block diagram of a semiconductor storage device 200 according to a second embodiment of the present invention. The semiconductor storage device 200 differs from the semiconductor storage device 100 in that it has an initializing voltage control circuit IVCC. In the first embodiment, the initializing voltage signal IVCS and the plate signal PS are input from the outside. However, the semiconductor storage device 200 incorporates an initializing voltage control circuit which generates the initializing voltage signal IVCS and the plate signal PS.

According to the second embodiment, the user executes initialization and the user can write data. In other words, the user can execute the steps S10 to S40 shown in FIG. 3.

THIRD EMBODIMENT

Figure 10:
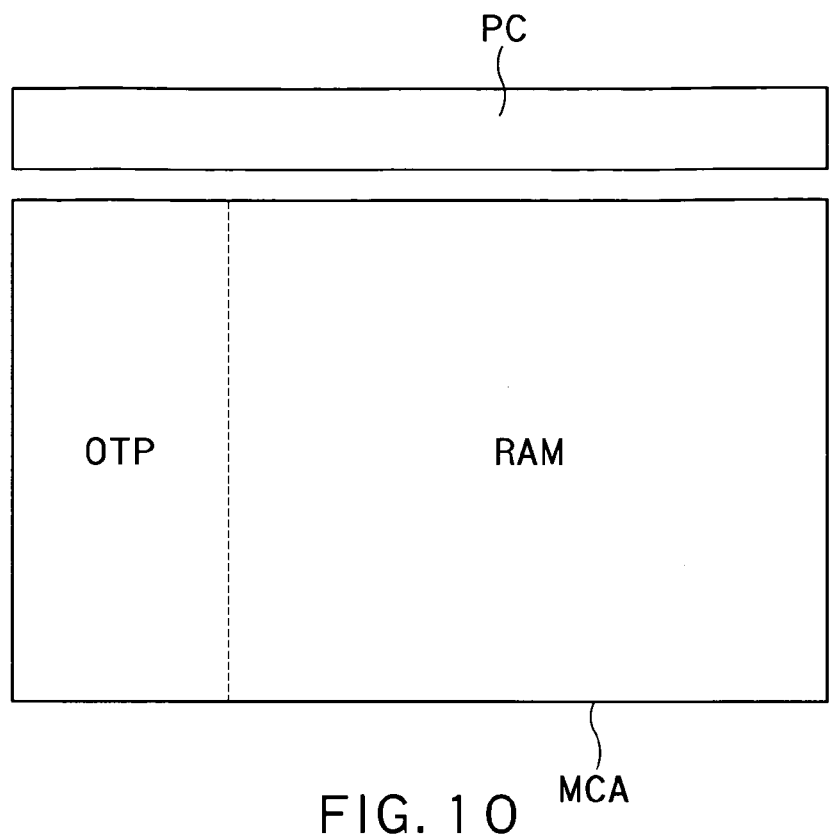
FIG. 10 is a configuration diagram of a semiconductor storage device according to a third embodiment of the present invention.

FIG. 10 is a configuration diagram of a semiconductor storage device according to a third embodiment of the present invention. The third embodiment uses the semiconductor storage device 100 or 200 according to the first or second embodiment.

The first and second embodiments can be used as an ordinary RAM as well by omitting initialization processing or using a single initializing voltage. In other words, the first and second embodiments can be used as an OTP memory which stores a plurality of bits in a single memory cell MC (hereafter referred to simply as OTP memory). Furthermore, the first and second embodiments can be used as a RAM which stores one bit in a single memory cell MC (hereafter referred to simply as RAM) as well.

The structure itself of the memory cell MC does not differ between the OTP memory and the RAM. For example, therefore, it is possible to use a part of a certain memory cell array MCA as the OTP memory and use another part as the RAM as shown in FIG. 10. As a result, it is possible to store an OS which does not need rewriting in an OTP memory region and store a program or a file which can be rewritten in a RAM region.

According to the third embodiment, the OTP memory and the RAM have the same structure, and consequently they can be formed at the same time by using the same manufacture process. A peripheral circuit PC such as the initializing voltage control circuit can be used in common in the OTP memory and the RAM.

FOURTH EMBODIMENT

Figure 11:
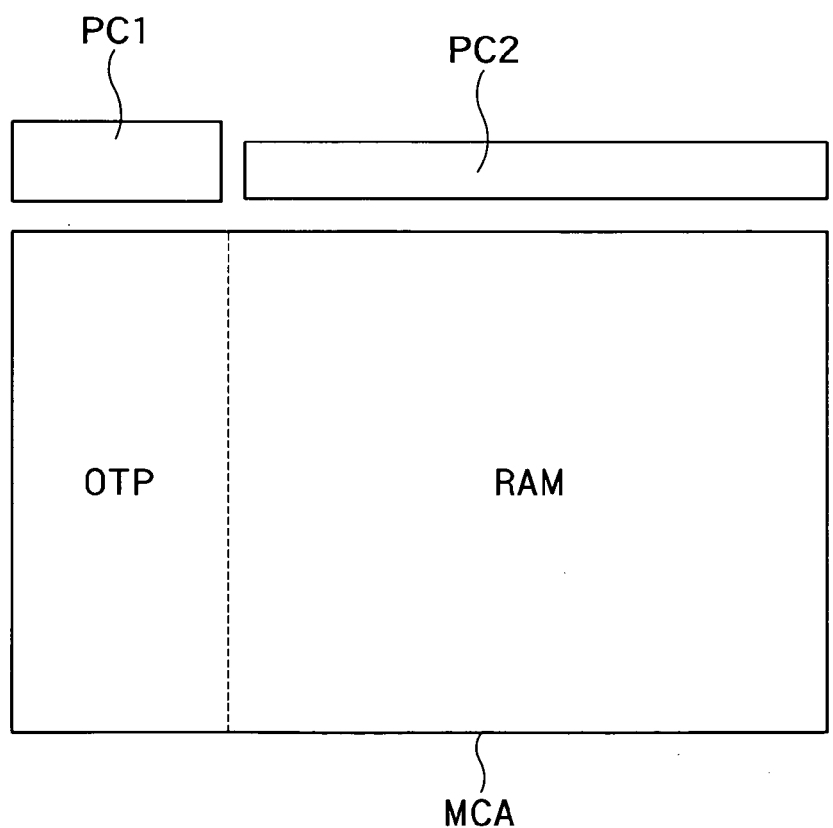
FIG. 11 is a configuration diagram of a semiconductor storage device according to a fourth embodiment of the present invention.

FIG. 11 is a configuration diagram of a semiconductor storage device according to a fourth embodiment of the present invention. A memory cell array MCA in the fourth embodiment is similar to that in the third embodiment. In the peripheral circuit portion, a peripheral circuit PC1 including the initializing voltage control circuit IVCC is connected only to the OTP memory. A peripheral circuit PC2 of the RAM does not include the initializing voltage control circuit IVCC. As a result, the area of the peripheral circuit region of the RAM can be made small. In the same way as the third embodiment, the fourth embodiment has an advantage that the OTP memory and the RAM can be formed at the same time by using the same manufacture process.

FIFTH EMBODIMENT

Figure 12A:
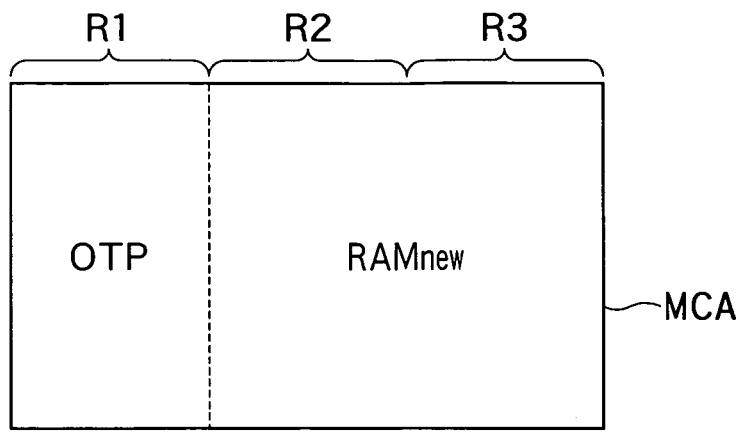
FIGS. 12A to 12C are configuration diagrams of a semiconductor storage device according to a fifth embodiment of the present invention.
Figure 12B:
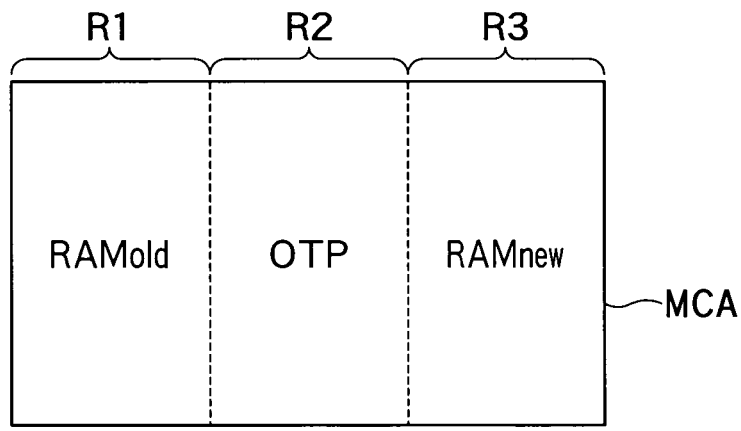
Figure 12C:
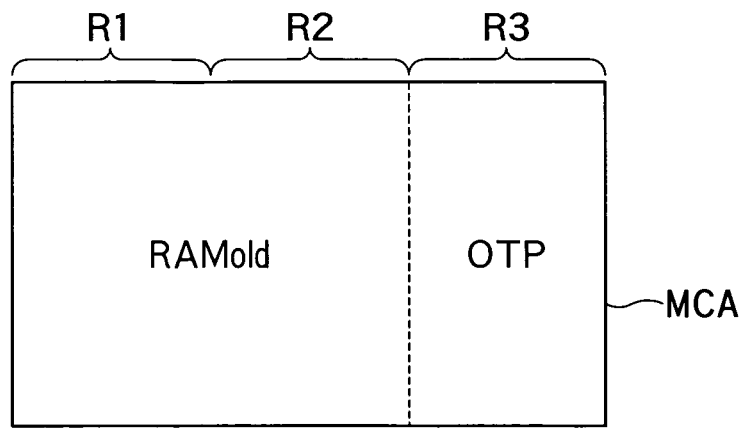

FIGS. 12A to 12C are configuration diagrams of a semiconductor storage device according to a fifth embodiment of the present invention. In the fifth embodiment, the memory cell array MCA is divided into three regions R1 to R3. In FIG. 12A, memory cells MC in the region R1 are initialized with one of a plurality of initializing voltages. As a result, each of memory cells MC in the region R1 is used as an OTP that can store a plurality of bits. Each of memory cells MC in the regions R2 and R3 is not initialized, but it is used as a RAM that can store one bit. The memory cell MC that is not subjected to initialization is referred to as RAMnew.

Data stored in the OTP cannot be updated. If it is necessary to update the data stored in the OTP, therefore, memory cells MC in the region R2 are initialized with one of a plurality of initializing voltages. As shown in FIG. 12B, therefore, each of the memory cells MC in the region R2 becomes an OTP that can store a plurality of bits, and it can store updated data.

On the other hand, each of the memory cells MC in the region R1 has been used as the OTP that can store a plurality of bits. However, it can also be used as a RAM that can use one bit. For example, if only the reference voltage Vref1 is used in FIG. 6, the signal voltages Vsig1 and Vsig3 should be regarded as data "1" and the signal voltages Vsig2 and Vsig4 should be regarded as data "0." A memory cell MC subjected to initialization and used as a RAM is referred to as RAMold. In the same way as the RAMnew, the RAMold can be used to read/write data.

In addition, if it is necessary to update data stored in the OTPs, the memory cells MC in the region R3 are initialized with one of a plurality of initializing voltages. As shown in FIG. 12C, each of memory cells MC in the region R3 becomes an OTP capable of storing a plurality of bits, and it can store updated data.

On the other hand, each of memory cells in the region R2 is used as a RAMold capable of storing a single bit in the same way as the region R1.

The OTP in the fifth embodiment may be an OTP according to the first or second embodiment. These OTPs do not differ in structure from the RAM. In the fifth embodiment, therefore, it is possible to cope with update of data stored in the OTPs by altering the OTP region and the RAM region in the memory cell array MCA as shown in FIGS. 12A to 12C.

(Test Method)

A test method for the ferroelectric memory according to the foregoing embodiments will now be described. Since the dielectric polarization characteristics of these ferroelectric memories change according to the applied voltage, it is difficult to actually write data at the time of test.

At the time of test, therefore, the voltage at the time of ordinary operation (i.e., read/rewrite) is used. As described above, the initializing voltage is equal to or higher than the voltage at the time of ordinary operation. After testing the operation of the ferroelectric memory with the voltage at the time of ordinary operation, therefore, the ferroelectric memory can be initialized.

Since this test is executed before the initialization, however, it cannot be tested whether a single memory cell can store a plurality of bits. After the initialization, therefore, it is necessary to conduct test again after data is written into the memory cell. At this time, a defective memory cell region may be replaced by a different memory cell region. The method of replacing a defective region may be similar to that dynamically conducted for a hard disk. In this case, the memory region is divided into a plurality of sectors, and continuous data is stored in discontinuous sectors. In this case, however, a control circuit dedicated to replacement and other circuits are needed.

SIXTH EMBODIMENT

Figure 13:
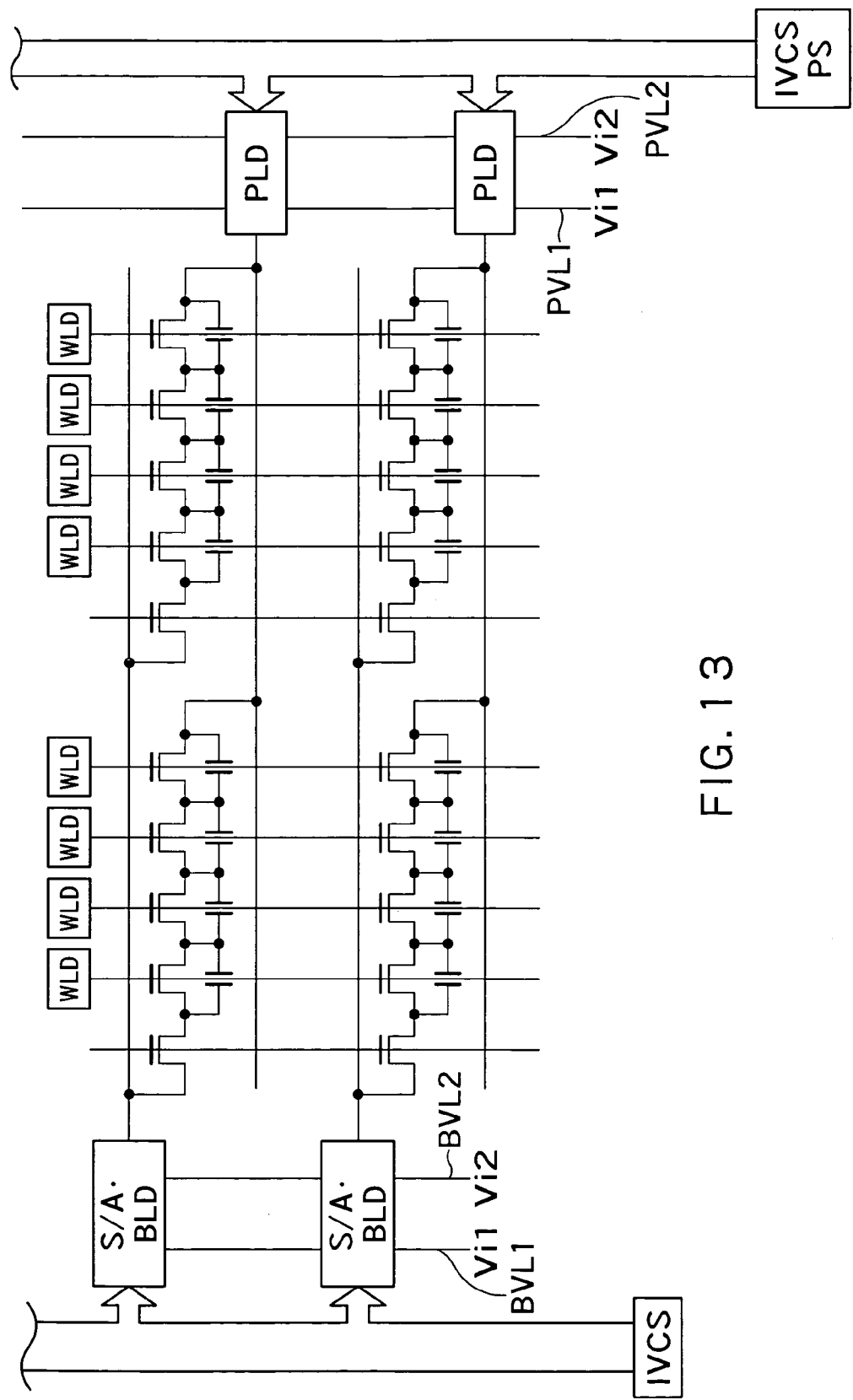
FIG. 13 is a configuration diagram of a semiconductor storage device according to a sixth embodiment of the present invention.

FIG. 13 is a configuration diagram of a semiconductor storage device according to a sixth embodiment of the present invention. In the sixth embodiment, architecture of a TC serial ferroelectric memory is used. Unlike the conventional TC serial ferroelectric memory, bit lines and plate lines are arranged in the present embodiment so that they will extend in the same direction. Owing to such a configuration, a voltage required to initialize each bit can be applied efficiently.

In the first embodiment, only one bit can be initialized at a time. In the case of the present embodiment, however, all cells sharing a word line can be initialized at the same time. Plate line drivers and bit line drivers shown in FIG. 13 may have the same configurations as those in the first embodiment. A read out method may also be the same as that in the first embodiment.

In the same way as the conventional TC serial ferroelectric memory, the bit lines and the plate lines may be arranged so that they will be perpendicular to each other. In this case, however, initialization is executed for one bit at a time in the same way as the first embodiment.

The invention claimed is:

1. A semiconductor storage devices, comprising:
a bit line;
a word line;
a plate line;
a ferroelectric capacitor having a ferroelectric substance between electrodes, one of the electrodes being connected to the plate line, the ferroelectric capacitor configured to store data;
a selection transistor connected between the other of the electrodes of the ferroelectric capacitor and the bit line, the selection transistor configured to selectively connect the ferroelectric capacitor to the bit line on the basis of a potential on the word line;
a bit line driver corresponding to the bit line to drive the bit line;
a word line driver corresponding to the word line to drive the word line; and
a plate line driver corresponding to the plate line, the plate line driver including a plurality of plate voltage lines configured to apply a plurality of different voltage values to the plate line, the plate line driver connecting a common single plate voltage line included in the plate voltage lines to the plate line when data is written or rewritten into the ferroelectric capacitor, wherein
when the ferroelectric capacitor is initialized, the plate line driver is capable of connecting the plate voltage lines including a higher voltage line and a lower voltage line to the plate line, the higher volume line has a higher voltage in absolute value than that of the lower voltage line,
when data is read from, written into, or rewritten into the ferroelectric capacitor, the plate line driver is capable of connecting a ground or the lower voltage line to the plate line.

2. The semiconductor storage device according to claim 1, wherein
the bit line driver includes a plurality of bit voltage lines configured to apply a plurality of different voltage values to the bit line, and connects a common single bit voltage line included in the bit voltage lines to the bit line when data is written into the ferroelectric capacitor.

3. The semiconductor storage device according to claim 1, wherein
the bit line driver selects any one of bit voltage lines, when the ferroelectric capacitor is initialized, so as to connect the selected bit voltage line to the bit line corresponding to the ferroelectric capacitor.

4. The semiconductor storage device according to claim 1, wherein, when a plurality of the ferroelectric capacitors are initialized, the ferroelectric capacitors are respectively connected to different plate voltage lines so as to have different polarization characteristics from each other,
wherein, when data is written into the ferroelectric capacitors, the ferroelectric capacitors are connected to a common single plate voltage line included in the plate voltage lines so as to store one of plural-bit data in each of the ferroelectric capacitors.

5. The semiconductor storage device according to claim 1, wherein
the number of the plate voltage lines used at the time of initializing the ferroelectric capacitor is equal to a half of the bit number of the data which can be stored in the ferroelectric capacitor.

6. The semiconductor storage device according to claim 3, wherein the number of the bit voltage lines used at the time of initializing the ferroelectric capacitor is equal to a half of the bit number of the data which can be stored in the ferroelectric capacitor.

7. The semiconductor storage device according to claim 1 further comprising:
a memory cell array including a plurality of memory cells having the ferroelectric capacitor and the selection transistor,
wherein, when the ferroelectric capacitors are initialized, either of the plate voltage lines is selected for each of the memory cells in a part of the memory cell array so as to connect the selected plate voltage line to the plate line corresponding to each of the memory cells,
wherein the ferroelectric capacitors in the other part of the memory cell array are not initialized.

8. The semiconductor storage device according to claim 1 further comprising:
a memory cell array including a plurality of memory cells having the ferroelectric capacitor and the selection transistor,
wherein, when the ferroelectric capacitors are initialized, either of the bit voltage lines is selected for each of the memory cells in a part of the memory cell array so as to connect the selected bit voltage line to the bit line corresponding to each of the memory cells,
wherein the ferroelectric capacitors in the other part of the memory cell array are not initialized.

9. The semiconductor storage device according to claim 1, further comprising:
an initializing voltage control circuit controlling the bit line driver and the plate line driver when the ferroelectric capacitor is initialized.

10. The semiconductor storage device according to claim 9 further comprising:
a memory cell array including a plurality of memory cells having the ferroelectric capacitor and the selection transistor, wherein
the initializing voltage control circuit controls the bit line driver and the word line driver connected to the memory cells in a part of the memory cell array, and does not control the bit line driver and the word line driver connected to the memory cells in the other part of the memory cell array.

11. The semiconductor storage device according to claim 1, wherein
the ferroelectric capacitor, after the initializing, has a polarization characteristic dependent on a voltage applied by one of the plate voltage lines and the bit voltage lines during the initializing.

12. An operation method of a semiconductor storage device, which comprises a bit line; a word line; a plate line; a ferroelectric capacitor having a ferroelectric substance between electrodes, one of the electrodes being connected to the plate line, the ferroelectric capacitor configured to store data; a selection transistor connected between the other of the electrodes of the ferroelectric capacitor and the bit line, the selection transistor configured to selectively connect the ferroelectric capacitor to the bit line on the basis of a potential on the word line; a bit line driver corresponding to the bit line to drive the bit line; a word line driver corresponding to the word line to drive the word line; and a plate line driver corresponding to the plate line and the plate line driver driving the plate line,
the method comprising:
selecting one of a plurality of plate voltages for the ferroelectric capacitor, when the ferroelectric capacitor is initialized, so as to apply the selected plate voltage to the plate line corresponding to the ferroelectric capacitor, the plate voltages including a higher plate voltage and a lower plate voltage, the higher plate voltage being higher in absolute value than the lower plate voltage;
applying a ground or the lower plate voltage to the plate line, but not applying the higher plate voltage to the plate line, when data is written into the ferroelectric capacitor;
reading out the data from the ferroelectric capacitor, using a ground or the lower plate voltage, but not using the higher plate voltage; and
applying a ground or the lower plate voltage to the plate line, but not applying the higher plate voltage to the plate line, when the data is rewritten into the ferroelectric capacitor.

13. The operation method of a semiconductor storage device according to claim 12, further comprising:
selecting one of a plurality of bit voltages for the ferroelectric capacitor, when the ferroelectric capacitor is initialized, so as to apply the selected bit voltage to the bit line corresponding to the ferroelectric capacitor;
applying a common single bit voltage included in the bit voltages to the bit line when data is written into the ferroelectric capacitor;
reading out the data from the ferroelectric capacitor; and
applying a common single bit voltage included in the bit voltages to the bit line in the bit line driver when the data is rewritten into the ferroelectric capacitor.

14. The operation method of a semiconductor storage device according to claim 12, wherein the semiconductor storage device further comprises a sense amplifier connected to the bit lines,
wherein the ferroelectric capacitor is configured to store one of n values of plural-bit data,
wherein, during reading out the data, the sense amplifier compares the data stored in the ferroelectric capacitor with (n-1) reference voltages.

15. The operation method of a semiconductor storage device according to claim 14, wherein, during reading out the data, the sense amplifier uses a median value between data "1" and data "0" which can be stored in the ferroelectric capacitor, to which the least plate voltage of the plate voltages is applied at the time of initializing of the ferroelectric capacitor, and in a case that the data stored in the ferroelectric capacitor is higher than the median value, the sense amplifier uses a reference voltage higher than the median value, and in a case that the data stored in the ferroelectric capacitor is lower than the median value, the sense amplifier uses a reference voltage lower than the median value.

16. The operation method of a semiconductor storage device according to claim 12, wherein, when a plurality of the ferroelectric capacitors are initialized, each of polarization characteristics of the ferroelectric capacitors is changed by applying either of the plate voltages to each of the ferroelectric capacitors and by applying either of bit voltages to each of the ferroelectric capacitors.

17. The operation method of a semiconductor storage device according to claim 12, wherein, the semiconductor storage device further comprises a memory cell array including a plurality of memory cells having the ferroelectric capacitor and the selection transistor, wherein, when the ferroelectric capacitors are initialized, the ferroelectric capacitors in a first region of the memory cell array are initialized, the memory cells in the first region are used as memory cells storing one of plural-bit data, and the memory cells in a second region different from the first region of the memory cell array are used as memory cells storing single-bit data, wherein, when the data stored in the first region are updated, the ferroelectric capacitors in the second region are initialized, the memory cells in the first region are used as memory cells storing single-bit data, and the memory cells in a second region are used as memory cells storing plural-bit data.

* * * * *